United States Patent [19]

Schneier et al.

[11] Patent Number: 5,051,627

[45] Date of Patent: Sep. 24, 1991

[54] SUPERCONDUCTING NONHYSTERETIC LOGIC DESIGN

[75] Inventors: Neal J. Schneier, Rancho Palos Verdes; Gerald R. Fischer, Playa Del Rey; Roger A. Davidheiser, Manhattan Beach; George E. Avera, Camarillo, all of Calif.

[73] Assignee: TRW Inc., Redondo Beach, Calif.

[21] Appl. No.: 459,220

[22] Filed: Dec. 29, 1989

[51] Int. Cl.$^5$ .............................................. H03K 19/95
[52] U.S. Cl. ................................... 307/476; 307/306; 365/162; 505/865
[58] Field of Search ............... 307/245, 277, 306, 462, 307/476; 357/5; 365/162; 505/874, 861, 865

[56] References Cited

U.S. PATENT DOCUMENTS

| | | | |
|---|---|---|---|
| 4,371,796 | 2/1983 | Takada | 307/462 |
| 4,623,804 | 11/1986 | Goto | 307/476 |
| 4,672,244 | 6/1987 | Harada et al. | 307/476 |

FOREIGN PATENT DOCUMENTS 0082533  4/1986  Japan ................................. 307/476

OTHER PUBLICATIONS

E. S. Schlig, "Highly Designable Josephson Binary Nonlatching Logic Circuits", IBM Tech. Disc. Bull., vol. 18, No. 12, May 1976, pp. 4201-4203.

*Primary Examiner*—John Zazworsky
*Attorney, Agent, or Firm*—Noel F. Heal; Ronald L. Taylor

[57] ABSTRACT

A family of logic circuits using nonhysteretic superconducting quantum interference devices (SQUIDs) connected together to perform various functions using a common operating principle. Each circuit has an output line, first and second power supply lines having first and second voltage states, and input lines that can have one of the two voltage states. A pull-up circuit, having at least one SQUID, is connected between the output line and the first power supply line, and the input lines are coupled to the pull-up circuit in such a manner as to pull the output line to the first voltage state only if the input lines conform with a selected combination of voltage states. A pull-down circuit, also having at least one SQUID, is connected between the output line and the second power supply line, to pull the output line to the second voltage state only when input lines do not conform with the selected combination of voltage states. A single configuration of SQUIDs can be connected to perform any of six different basic Boolean logic functions on signals applied to the input lines. Additional SQUIDs allow the performance of more complex logic functions. A slightly different arrangement of SQUIDs operates as a two-port random access memory cell.

24 Claims, 8 Drawing Sheets

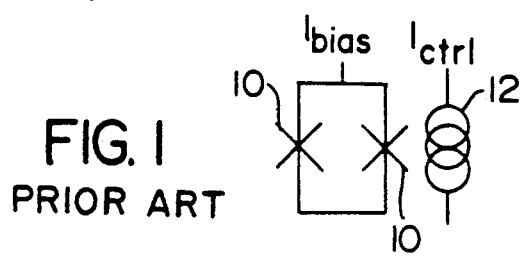
FIG. I
PRIOR ART
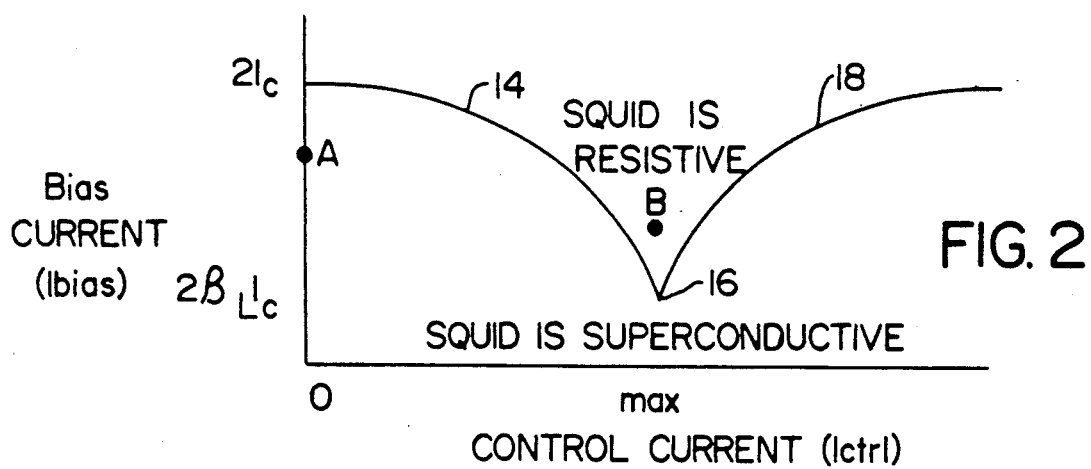
FIG. 2

SUPERCONDUCTING NONHYSTERETIC LOGIC DESIGN

BACKGROUND OF THE INVENTION

This invention relates generally to digital logic circuits using superconducting circuit elements and, more particularly, to digital logic circuits using nonhysteretic superconducting circuit components. Superconducting circuit elements known as Josephson junctions have been used, or proposed for use, in a wide variety of high-speed computational applications, including digital logic, random access memories, and analog-to-digital converters. Josephson junctions employing various metals that have superconductive properties at very low temperatures exhibit a characteristic hysteresis effect, which has been used to advantage in the design of high-speed digital logic.

Hysteretic devices include a common three-layer structure comprising superconductor, oxide and superconductor. Nonhysteretic devices were known, but not widely used, and include point contact devices, weak-link microbridges, high current density oxide barrier junctions, and three-layer structures with semiconductor barrier layers such as Si or Ge-Sn. Although hysteresis can complicate circuit design, it does provide a device with two well-defined logic states. In addition, the hysteresis gives high effective current gain in the switching elements; that is to say a small control signal can result in a large output signal. In contrast, the same circuits made from nonhysteretic junctions have greatly reduced gain and ill-defined logic levels.

In recent years, researchers have discovered that various ceramic materials exhibit superconductivity at much higher temperatures than metals, allowing the operation of superconducting circuits with lower cooling requirements and higher overall energy efficiencies. However, these newer superconducting materials are of the nonhysteretic type, and previously developed logic designs for superconducting devices are no longer applicable.

By way of further background, a basic superconducting circuit element frequently used in digital logic is known by the acronym SQUID, for superconducting quantum interference device. SQUIDs depicted in this specification are of the direct current (dc) type, having two or more Josephson junctions and at least one control inductor. Depending on the magnitude of a control current passed through the inductor and the magnitude of a bias current passed through the junctions, the SQUID can be made to operate in either a superconducting state, with a practically zero impedance, or a conventional resistive state.

One technique that has been suggested for improving the performance of nonhysteretic superconductive circuits is described in U.S. Pat. No. 4,342,924 to Howard et al. A positive feedback path is used to enhance the effect of a control current used to switch from the superconductive to the resistive state. Although the use of positive feedback in this way enhances operation of a nonhysteretic superconducting circuit, the Howard et al. patent offers no general solution to the problem of circuit design with nonhysteretic devices.

It will be appreciated from the foregoing that there is a need for a new technique employing nonhysteretic superconducting elements in digital logic and related circuitry. The present invention is directed to this end.

SUMMARY OF THE INVENTION

The present invention resides in a novel arrangement of nonhysteretic superconducting circuit elements that provides improved current gain and well-defined logic levels suitable for digital logic design. The basic circuit arrangement of the invention can be easily configured to perform both simple and complex logic functions. An important advantage of the circuit and of the invention is that a single simple configuration of circuit elements can be used to perform any of a number of selected logic functions by merely changing power supply and input signal connections.

Briefly, and in general terms, the circuit of the invention comprises an output circuit, at least one pull-up nonhysteretic SQUID, connected to selectively couple the output circuit to a first power supply line having a first voltage state, at least one pull-down device, preferably a nonhysteretic SQUID connected to selectively couple the output circuit to a second power supply line having a second voltage state, and at least one input circuit, connected to the pull-up and pull-down SQUIDs. The voltage states applied to the input circuit, or circuits, control switching of the SQUIDs between a superconducting state and a resistive state. Basically, the output circuit is pulled to the first or the second voltage state, depending on the states of signals applied to the input circuit or circuits.

This general principle is applied to a variety of logic circuits. One embodiment of the invention functions as a non-inverting output buffer. Specifically, the pull-up SQUID has a control inductor with one terminal connected to the first power supply line and the other terminal connected to the input circuit. The pull-down SQUID has a control inductor with one terminal connected to the second power supply line and the other terminal connected to the input circuit. The voltage state of the input circuit determines which of the SQUIDs becomes superconductive, and this determines the voltage state of the output circuit.

A variant of the output buffer embodiment uses a series-connected string of SQUIDs instead of a single pull-up SQUID, and another series-connected string of SQUIDs instead of a single pull-down SQUID. The control inductors in each string of SQUIDs are also connected in series. The series connection of multiple SQUIDs permits the output circuit to be pulled up to a higher voltage, to drive additional circuitry of a higher characteristic impedance.

In one basic embodiment of the invention, there are multiple pull-up SQUIDs, to which multiple input signals are connected to perform a desired logic function. The output circuit is pulled to the first voltage state only when the input signals together satisfy the desired logic function. For, example, there may be two pull-up SQUIDs connected in parallel to perform a logical NAND operation on two input signals. In this case, the voltage applied to the first power supply line is a logical "high" signal and the voltage applied to the second power supply line is a logical "low" signal. The input circuits are connected to respective control inductors of the pull-up SQUIDs, the other terminals of the inductors being connected to the second power supply line. One of the input circuits must have a logical "low" input signal for the output circuit to be pulled to the "high" level of the first power supply line. Therefore, a "high" output is generated if the logical NAND of the input signals is "high."

As will be explained in more detail, other logic functions can be performed by merely changing the power supply connections and the connections of the input signals to the control inductors. The same set of SQUIDs can be used to perform NAND, AND, OR, NOR, EXOR, or XNOR operations. Moreover, another family of embodiments can perform the same operations using multiple pull-up SQUIDs connected in series instead of in parallel.

Another important embodiment of the invention is a random access memory cell. In this circuit, the pull-up SQUID has a control inductor connected by one terminal to the first power supply line and the pull-down SQUID has a control inductor connected by one terminal to the second power supply line. The input circuit includes a data input terminal, a write SQUID, for selectively transmitting a data input signal onto the data input terminal, in the presence of a write signal applied to the write signal control inductor, and means for connecting the data input terminal to the other terminals of the control inductors of the pull-up and pull-down SQUIDs. A data signal of the first or second voltage states causes the pull-up or the pull-down SQUID to superconduct, pulling the output circuit to the first or second voltage state.

Ideally, the memory cell also includes a feedback SQUID connected between the output circuit and the data input terminal. The feeback SQUID has a control inductor connected to render the SQUID superconductive only when the write SQUID is not. Therefore, a data input signal is transferred from the input circuit to the output circuit on the occurrence of the write signal, and is maintained on the output circuit by the feedback SQUID after the write signal is removed. For reading from the cell, the circuit includes a read SQUID, having a control inductor to which a read signal is applied to render it superconductive when data is to be read from the output circuit.

It will be appreciated from the foregoing that the present invention, in its various forms, represents a significant advance in the field of superconductive logic and computing devices. In particular, the invention provides a family of logic devices, including a memory cell, using nonhysteretic SQUIDs as the basic elements. Other aspects and advantages of the invention will become apparent from the following more detailed description, taken in conjunction with the accompanying drawings.

BRIEF DESCRIPTION OF THE DRAWINGS

FIG. 1 is a simplified schematic symbol representation for a SQUID and its associated control inductor;

FIG. 2 is a graph showing variation of bias current in a SQUID with equal critical currents in both Josephson junctions, versus control current in the control inductor;

DESCRIPTION OF THE PREFERRED EMBODIMENTS

Figure 3:
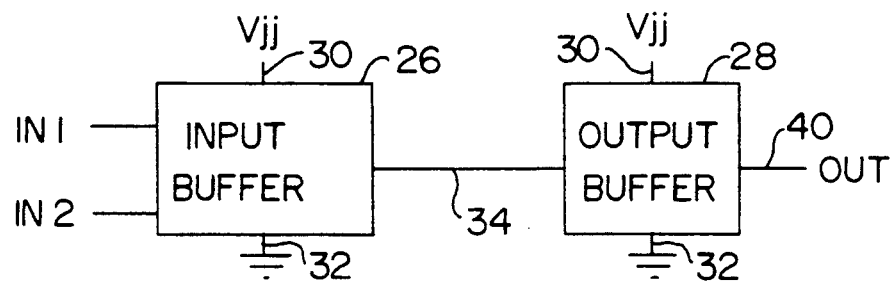
FIG. 3 is a generalized block diagram of a logic gate in accordance with the invention.

As shown in the drawings for purposes of illustration, the present invention is concerned with digital logic and related circuitry formed from superconducting circuit elements, specifically Josephson junctions and superconducting quantum interference devices, or SQUIDs. Until recently, the design of digital logic using superconducting devices depended largely on the hysteretic nature of the devices. The availability of superconducting materials operating at higher temperatures than before has rendered much of this digital logic ineffective, since the newer superconducting devices are of the nonhysteretic type.

In accordance with the present invention, a basic digital logic circuit provides well-defined logic states using nonhysteretic Josephson junctions. A single configuration of the basic circuit of the invention may be employed to perform any of the basic Boolean logic functions, and other configurations may be easily formed for more complex logic functions. The basic circuit of the invention may also be used in a configuration that functions as a random access memory cell.

The circuit of the invention is formed as a combination of superconducting Josephson junctions and SQUIDs, so it will be helpful to first review the properties of a two-junction SQUID, shown schematically in FIG. 1. Each SQUID includes two Josephson junctions of equal critical current, indicated by reference numeral 10, connected in parallel to receive a total current referred to as the bias current $I_{bias}$, and an associated control inductor 12, receiving a control current $I_{ctrl}$.

The junctions 10 are, as is conventional, shown by an X symbol. The SQUID operates in either a superconductive state or a resistive state, depending principally on the levels of the control current and bias current, as shown graphically in FIG. 2. At zero control current, operation is superconductive for bias currents below a threshold bias current $2I_c$, and is resistive for bias currents above this level. The value of this threshold or critical current decreases as the control current is increased, as indicated by the curve 14 in FIG. 2. The threshold bias current continues to decrease until a discontinuity is reached in the curve 14, indicated at 16, beyond which further increase in the control current causes the threshold bias current to increase again, as shown by the curve 18. For the purposes of this invention, the value of the control current at the discontinuity 16 is defined as the maximum value of $I_{ctrl}$ FIG. 2 assumes that the two junctions have the same bias currents. More efficient gate switching may be realized with unequal bias currents, which would result in a modification to FIG. 2.

For purposes of explanation, it will be assumed that the SQUID operates at one of two operating points, referred to as A and B in FIG. 2. Operating point A is located on the vertical axis of FIG. 2, i.e. at a point of zero control current and in the superconductive region. Operating point B is located at a point of "maximum" control current, immediately above the discontinuity 16 and in the resistive region of the SQUID's characteristic curve. Movement between these two operating points is implied when a SQUID is described as being switched between its superconductive and resistive states.

FIG. 3 shows the logic gate circuit of the invention in generalized form, including an input buffer 26 and an output buffer 28. The function of the logic gate is to process one or more input signals, two of which are shown (IN1 and IN2), and to derive from the input signals an output signal, designated OUT in the figure. It will be understood that some logic functions, such as simple inversion, have only a single input signal, and other logic functions may have more than two input signals. However, for purposes of explanation, a two-input NAND gate will be described in some detail in this specification.

Power supplies at a voltage $V_{jj}$ are connected to the input buffer 26 and the output buffer 28, as indicated at 30, and a common ground line connected to the buffers, as indicated at 32. A required Boolean logic function is performed in the input buffer 26 and the result is obtained on line 34 which connects the input buffer 26 to the output buffer 28. The only purpose of the output buffer 28 is to provide a "fan-out" of the output signal, i.e. to allow it to be connected to more than one destination circuit. The nature of the input buffer 26 is such that it may not be conveniently fanned out to multiple circuits. However, in situations where the logical result on line 34 needs be supplied to only one other circuit, the output buffer 28 need not be used.

Figure 4:
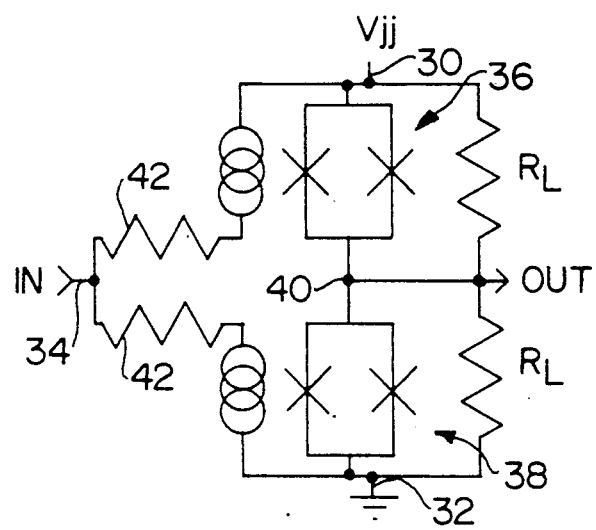
FIG. 4 is a schematic diagram of an output buffer of the logic gate of the invention.

Both the output buffer 28 and the input buffer 26 operate on the same principle, and it will simplify explanation if the simpler circuit, the output buffer, is described first. As shown in FIG. 4, the output buffer 28 includes two SQUIDs 36 and 38, referred to for convenience as the pull-up SQUID and the pull-down SQUID. The parallel-connected Josephson junctions of the pull-up SQUID 36 and the parallel-connected Josephson junctions of the pull-down SQUID 38 are connected in series between the $V_{jj}$ power supply line 30 and the ground line 32. The output signal OUT is derived from the junction point 40 between the two SQUIDs 36, 38. A load resistance $R_L$ is shown as being connected between the output OUT and the ground line 32, and another load resistance $R_L$ is shown as being connected between the output OUT and the power supply line 30. The control inductor associated with the pull-up SQUID 36 has one terminal connected to the power supply line 30 and the other connected through a resistor 42 to the IN line 34. Similarly, the control inductor for the pull-down SQUID 38 has one terminal connected to the ground line 32 and the other connected through resistor 44 to the IN line 34.

In operation, the signal on IN line 34 can be either high or low, i.e. at voltage $V_{jj}$ or at ground. If the input signal on line 34 is high, current flows through the control inductor of the pull-down SQUID 38 but not through the control inductor of the pull-up SQUID 36. Therefore, the pull-up SQUID is superconductive (operating point A in FIG. 2) and the pull-down SQUID is resistive (operating point B in FIG. 2). The output line OUT is effectively shorted to the $V_{jj}$ power line 30 by the superconductive pull-up SQUID 36. If the input signal on line 34 is low, the states of the two SQUIDs are reversed and it is the pull-down SQUID 38 that is superconductive, effectively shorting the output line OUT to the ground line 32. In short, the output buffer 28 operates to transfer the state of an input signal (high or low on the IN line 34) to the OUT line of the buffer.

Figure 5:
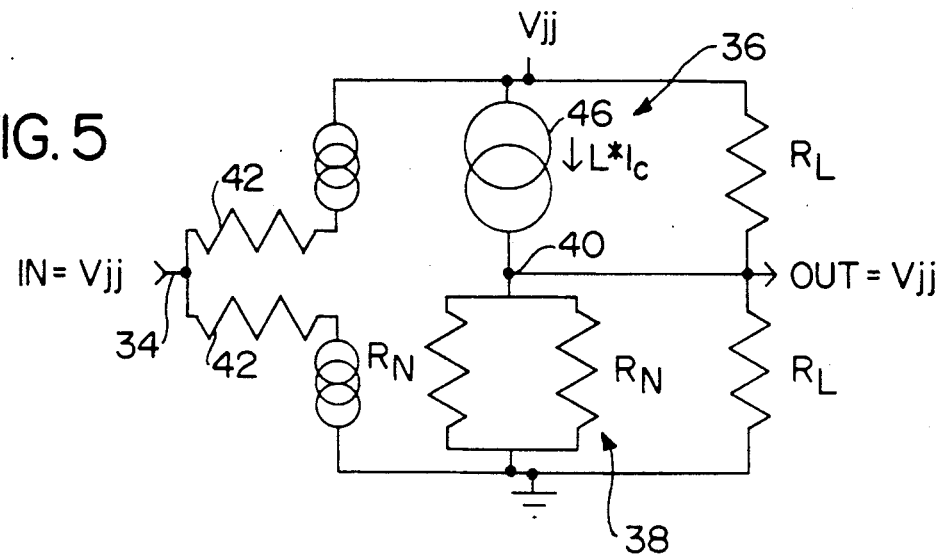
FIG. 5 is a schematic diagram showing the equivalent circuit of the output buffer of FIG. 4 when its input signal is in a high state.

FIG. 5 is the equivalent circuit of the output buffer of FIG. 4, shown for the case in which the input signal is $V_{jj}$. Five equations specify the design of the output buffer 28, as will be confirmed from FIG. 5. First, the current through the load resistor $R_L$ is the control current that drives following logic gates that may be connected "downstream" of the output buffer. This is given by the equation:

$$I_L = V_{jj}/R_L = \text{Fan out} * I_{ctrl} \qquad (1)$$

The pull-up SQUID 36 in FIG. 5 is an equivalent current source 46 driving the load resistance and the resistive lower SQUID 38, as approximated by the equation:

$$\text{Current source current} = L*I_c = 2I_c \\ (\beta_L)^2 + (V_{jj}/V_n)^2 + V_{jj}/R_L \qquad (2)$$

where $\beta_L$ is a constant for the SQUID and $V_n$ is the SQUID characteristic voltage given by:

$$V_n = I_c * R_n, \qquad (3)$$

where $R_n$ is the equivalent resistance of each junction in the resistive SQUID 38. It will be noted from FIG. 2 that the bias current Ibias reaches a minimum value of $2\beta_L I_c$ when the control current Ictrl is at its maximum point. The first half of the expression for the current supplied by the current source 46 is the current driving the resistive SQUID 38, and the second half of the expression is the current driving the load resistance.

The third equation defining the output buffer 28 is:

$$I_{ctrl} * V_{jj} = P_{min} = 1\mu W, \qquad (4)$$

where Pmin is the minimum power dissipation of the circuit, as determined by thermal noise analysis and bit error rate requirements.

A fourth design consideration for the output buffer is that the smaller the load resistor, the less current goes through the resistive SQUID and the more that is available to drive the load. That is:

$$K * R_n = R_L,  \quad (5)$$

where K is the ratio of load resistance to the equivalent resistance of a SQUID junction in its resistive state.

Figure 6:
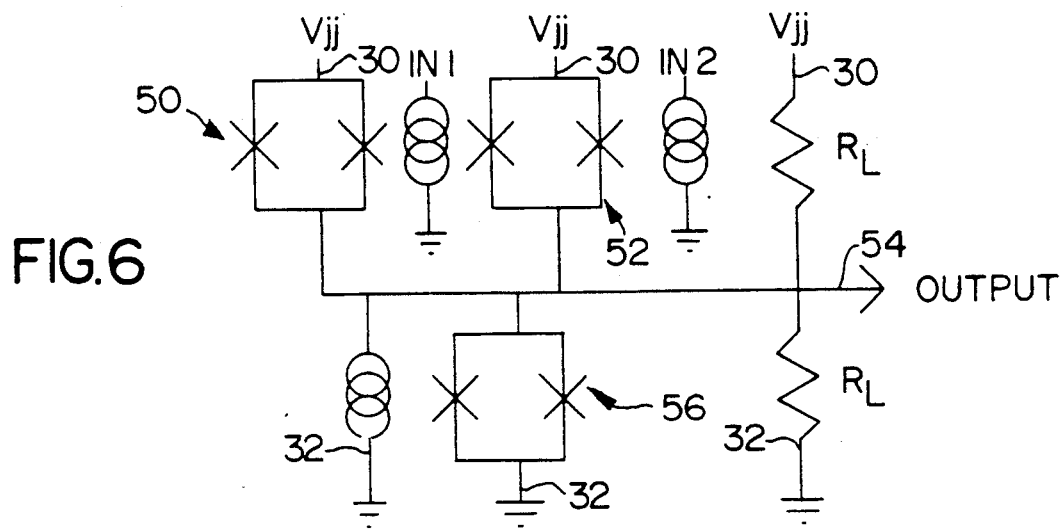
FIG. 6 is a schematic diagram of an input buffer of the invention, configured to perform a NAND function on two input signals.

The input buffer 26 (FIG. 3) is shown by way of example in FIG. 6. The principal function of the input buffer is to perform a selected logical function on one or more input signals. The example illustrated is the case of a Boolean NAND operation performed on two input signals, designated IN1 and IN2. As in the output buffer, the input buffer circuit has an power supply line, indicated as $V_{jj}$ and a ground line, shown by the ground symbol. The input buffer may be considered, in general, to have two parts: one or more pull-up SQUIDs to perform the selected Boolean logic function, and a pull-down superconductive device, preferably a SQUID (although an individual Josephson junction or a resistor could be used), to connect the input buffer to the ground or low state.

The terms "pull-up" and "pull-down" should not be taken too literally. They are used here as terms of reference, to indicate a direction in the drawings rather than a direction on a voltage scale. That is to say, the terms indicate that the output of the input buffer is either pulled "up" to the voltage of the upper power supply ($V_{jj}$ in FIG. 6) or pulled "down" to the voltage of the lower power supply line (ground in FIG. 6). In some configurations to be discussed, the power supply connections are reversed and the ground voltage is applied to the "upper" power supply line. For convenience, the SQUIDs referred to as pull-up SQUIDs in reference to FIG. 6 will still be referred to as pull-up SQUIDs, even though they function to pull the output voltage to ground. Similarly, the lower SQUID in FIG. 6 is referred to as a "pull-down" SQUID throughout, even though it functions in other illustrated configurations to pull the output voltage of the circuit above ground.

The illustrated input buffer has two pull-up SQUIDs 50 and 52, both connected between the $V_{jj}$ power line and an OUTPUT line 54. The input signals IN1 and IN2 are connected to one terminal of each of the control inductors associated with the pull-up SQUIDs 50, 52, the other terminal of each inductor being connected to ground. One load resistor $R_L$ is connected between the OUTPUT line 54 and the $V_{jj}$ line and a similar load resistor is connected between the OUTPUT line and ground. The pull-down SQUID, indicated at 56, is connected between the OUTPUT line 54 and ground, and its control inductor is similarly connected.

In operation, the input buffer OUTPUT is either pulled up to the $V_{jj}$ voltage or pulled down to the ground voltage, depending on the nature of the input signals on IN1 and IN2. If either of the input signals is low, its associated SQUID superconducts, pulling the OUTPUT line 54 up to the $V_{jj}$ voltage. Control current flows through inductor 32, suppressing the critical current of the pull-down SQUID 56. The superconductive SQUID's current exceeds the pull-down SQUID's suppressed current plus the load current, which renders the pull-down SQUID resistive. If both inputs are high, both of the pull-up SQUIDs are suppressed and operate in the resistive state. However, the current through the pull-up SQUIDs is less than the critical current of the pull-down SQUID 56, which renders the pull-down SQUID superconductive. The OUTPUT line 54 is thereby shorted to ground, but only if both inputs low.

It will be seen that this operation is equivalent to a logical NAND function performed on the input signals. A low output is produced only if both inputs are high; otherwise the output is high.

In an alternative form of the input buffer, not illustrated, the pull-down SQUID 56 and its control inductor are replaced by a single resistor, which performs the same pull-down function. However, the resistor always has a voltage drop across it, reducing the digital logic margins. The pull-down SQUID is preferred because it is shorted to a power supply when the SQUID is superconductive. In another alternative form of the input buffer, not illustrated, the pull-down SQUID 56 and its control inductor are replaced by a single Josephson junction, which performs the same pull-down function. However, such a junction always draws a significant current, even when not in the superconductive state, and the use of a pull-down SQUID is preferred because it draws less current in the resistive state.

Figure 7:
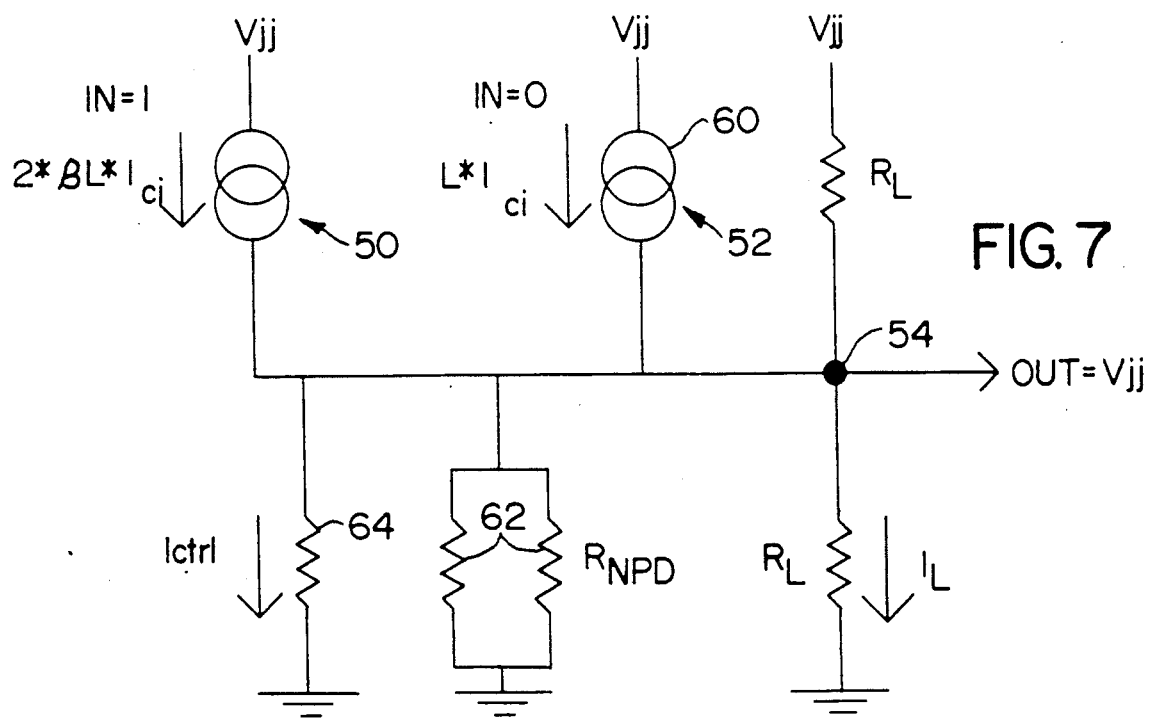
FIG. 7 is a schematic diagram showing the equivalent circuit of the input buffer of FIG. 6 when one input is in the "low" state and the other input is in the "high" state.

FIG. 7 depicts the NAND input buffer equivalent circuit when one input is low and the other input is high. Pull-up SQUID 50 has a high input and is suppressed, represented by a current generator 58 with a current $2*\beta_L*I_{ci}$. Pull-up SQUID 52 has a low input and is represented by a current generator 60 with a current $L*I_{ci}$. The pull-down SQUID 56 is in the resistive state, represented by two resistors 62 $R_{NPD}$ in parallel. The control inductor for the pull-down SQUID 56 is also represented by a resistor 64. Equations (3)–(5) also apply to the input buffer. The relationship between currents in the circuit are defined by two inequalities. First, when an input is low, the superconducting pull-up SQUID supplies current to the resistive pull-down SQUID 56 and to the load resistor $R_L$, and the required inequality is:

(ct. from Vjj) ≧ (critical ct. in pull-down) + (load and control cts.)  (6)

More specifically, the current supplied from $V_{jj}$ when one pull-up SQUID is superconducting is:

$$L*I_{ci} + 2(\text{Fin}-1)\beta_L I_{ci},$$

where $I_{ci}$ is the critical current for an input or pull-up SQUID, and Fin is the "fan-in," i.e. the number of input signals processed by the input buffer. The first part of this expression represents the current from the one input SQUID that is superconductive, and the second part represents the total current from the remaining suppressed input SQUIDs. The critical current for the pull-down SQUID is approximated by:

$$2I_{cpd}\sqrt{(\beta_L)^2 + (V_{jj}/V_n)^2} .$$

The load current is $I_L = V_{jj}/R_L$, and the control current for the pull-down SQUID is Ictrl.

Another inequality applies when both (or all) inputs are high. Then the pull-down SQUID is superconductive and the required inequality is:

(ct. through pull-down) ≧ (critical ct. in pull-up) + (load ct.)  (7)

The current through the pull-down SQUID is $L*I_{cpd}$, and the current through a pull-up SQUID in the resistive state is approximately $$2I_{ci}\sqrt{(\beta_L)^2 + (V_{jj}/V_n)^2}\ .$$

Figure 8:
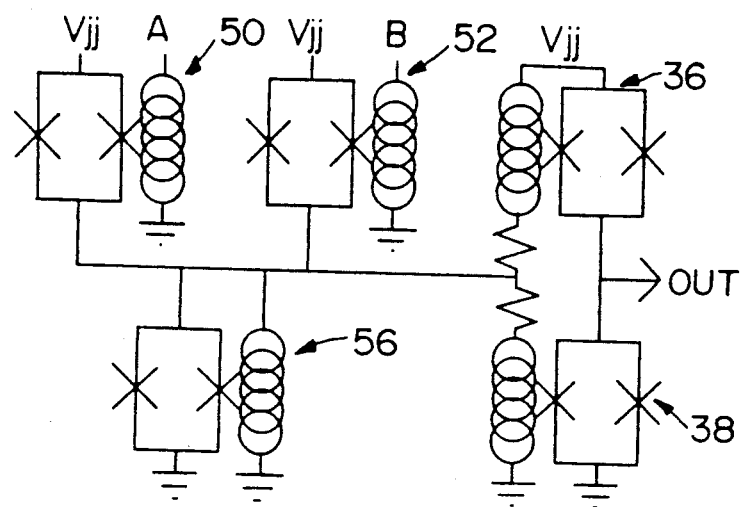
FIG. 8 is a schematic diagram of a complete logic gate for performing a logical NAND function, including the input buffer of FIG. 6 and the output buffer of FIG. 4.

FIG. 8 is a complete schematic of the NAND gate example described above, wherein the output line 54 of the input buffer is shown coupled directly to the input line 34 of the output buffer. The inputs are referred to in this figure, and the next five figures, as A and B. FIGS. 10–14 are similarly structured gates configured to perform other logical functions. Significantly, each of the gates in FIGS. 9–12 employs the same SQUIDs, and each of the gates in FIGS. 13–15 employs the same SQUIDs. The difference between the SQUIDs in FIGS. 9–12 and those in FIGS. 13–15 arises only because the critical currents of circuits with one pull-up will be different from the critical currents of circuits with one pull-up. The principal difference between any two of the figures lies in the manner in which power supplies and the A and B inputs are connected to the input buffer. What makes FIGS. 9–14 of great importance is that four different logical functions, namely NAND, AND, OR, and NOR, are performed using exactly the same set of SQUIDs. Similarly, three additional logical functions, INVERTER, XNOR and EXOR, use exactly the same set of SQUIDs. Therefore, extremely complex combinations of logic gates can be fabricated using multiple identical structural cells. Only the external connections to the power supply and the signal inputs need be changed to obtain the different required logical functions.

Figure 9:
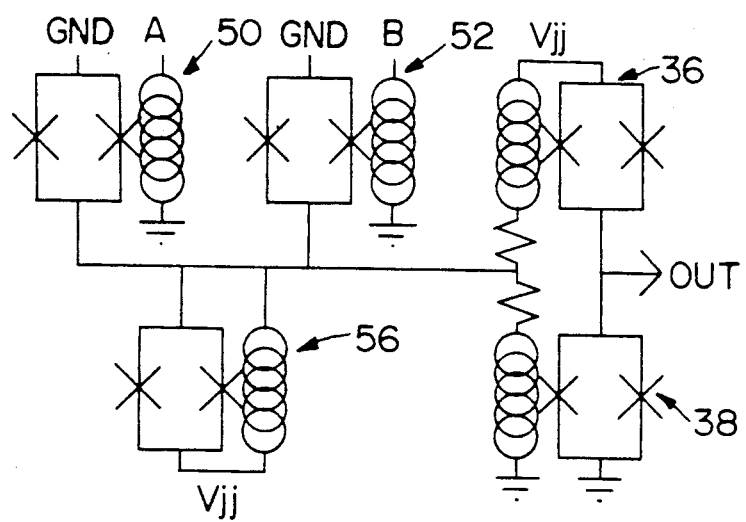
FIG. 9 is a schematic diagram similar to FIG. 8, but connected to perform a logical AND function.

In the AND gate of FIG. 9 the inputs are connected in the same way as in the NAND gate of FIG. 8, but the power supply connections to the input buffer are reversed. Thus, the pull-up SQUIDs at the top of the figure function to pull the output voltage to ground, and the pull-down SQUID now functions to pull the output voltage to $V_{jj}$. When any one input is low, no control current flows for that SQUID and it becomes superconductive, pulling the output to ground. When both inputs are high, the SQUIDs 50, 52 are resistive and SQUID 56 pulls the output high to $V_{jj}$, thereby performing the AND function.

Figure 10:
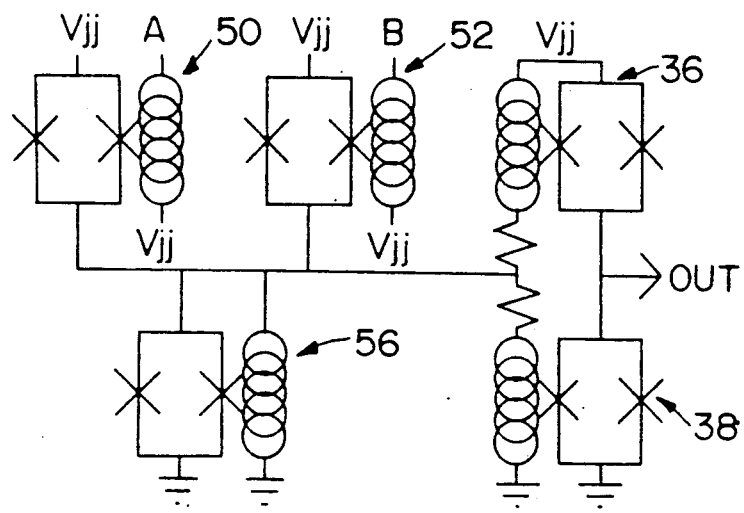
FIG. 10 is a schematic diagram similar to FIG. 8, but connected to perform a logical OR function.

In the OR gate of FIG. 10, the inputs A and B are applied to the control inductors of SQUIDs 50, 52, as in FIG. 8, but the other ends of the inductors are not grounded. They are instead connected to $V_{jj}$, which inverts the sense of the input signals. When an input signal is high in FIG. 10, no control current flows. When the input signal is low, control current flows. Therefore, when either A or B is high, at least one one of the pull-up SQUIDs 50, 52 will be superconductive and the output will be high. If both inputs are low, both pull-up SQUIDs 50, 52 will be resistive and the pull-down SQUID 56 will keep the output grounded.

Figure 11:
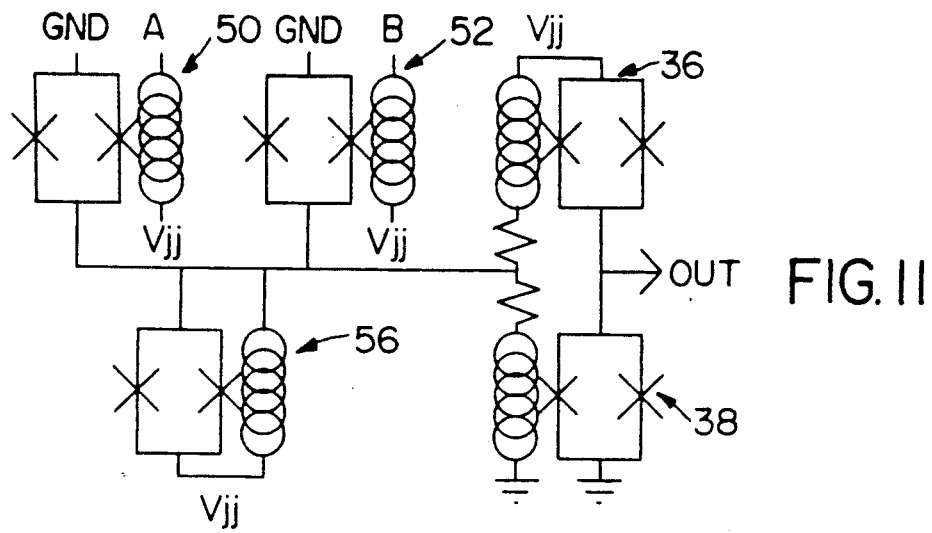
FIG. 11 is a schematic diagram similar to FIG. 8, but connected to perform a logical NOR function.

The NOR function in FIG. 11 is the same as the OR circuit except that the power supply and ground connections to the input buffer, but not to the control inductors, are reversed. If both A and B input signals are low, then the output will be pulled high to $V_{jj}$ by SQUID 56.

Figure 12:
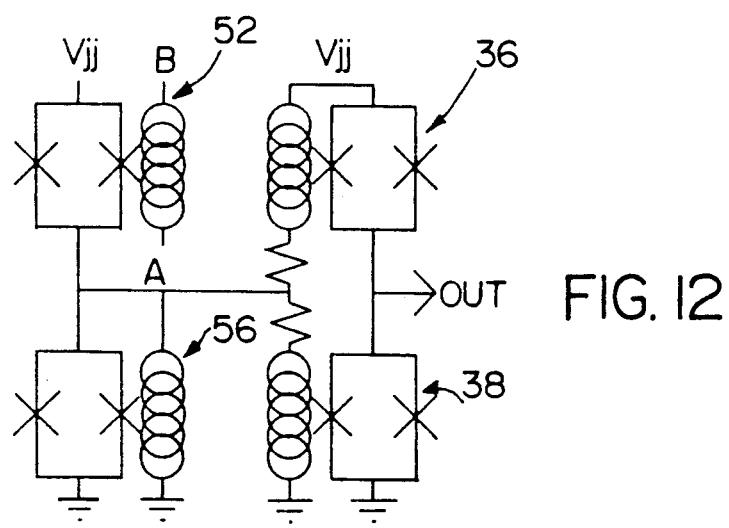
FIG. 12 is a schematic diagram including a portion similar to FIG. 8, but configured to perform a logical XNOR function.
Figure 13:
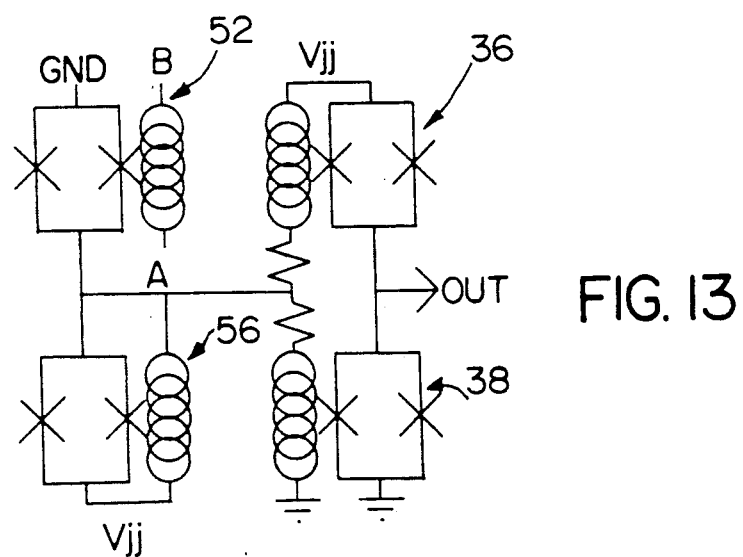
FIG. 13 is a schematic diagram including a portion similar to FIG. 9, but configured to perform a logical EXOR function.

The exclusive NOR (XNOR) gate of FIG. 12 uses only one pull-up SQUID 50 in the input buffer. The power supply is connected in the same manner as in FIG. 8, with $V_{jj}$ being connected to SQUID 50 and ground to the pull-down SQUID 56. The input signals A and B are applied to opposite ends of the control inductor for SQUID 50. Thus, when A and B are the same, either both high or both low, no control current will flow for SQUID 50, which will then be superconductive, pulling the output high. The exclusive OR (EXOR) gate of FIG. 13 differs from FIG. 12 only in that the power supply and ground connections to the input buffer SQUIDs are reversed. Thus, when A and B input signals are different, i.e. either one is high, but not both, then the upper SQUID 50 will be resistive and the lower SQUID 56 will be superconductive, pulling the output up to the $V_{jj}$ level.

Figure 14:
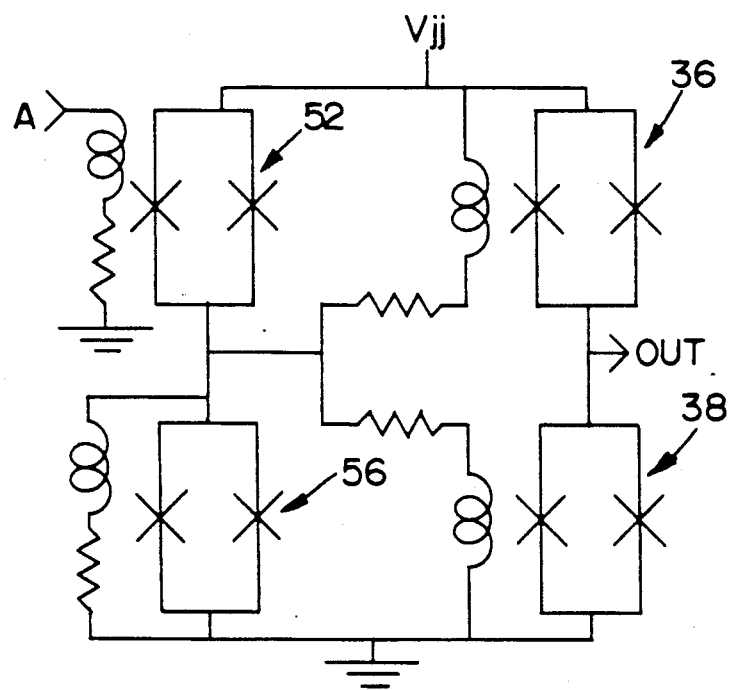
FIG. 14 is a schematic diagram including a portion similar to FIG. 8, but configured to perform a logical INVERTER function.

The INVERTER gate of FIG. 14 uses only one pull-up SQUID 50 in the input buffer. This power supply is connected in the same manner as in FIG. 8, with $V_{jj}$ being connected to SQUID 50 and ground to the pull-down SQUID 56. The input signal A is applied to one end and ground to the other end of the control inductor of the SQUID 50. If A input is low, then the output will be pulled high to $V_{jj}$ by SQUID 50.

It will be observed that all of the forms of input buffer shown in FIGS. 9–14 have certain features in common. They all have first and second power lines, in the form of a $V_{jj}$ power line and a ground line, and they all have at least one pull-up SQUID connected between one power line and the output line, at least one pull-down SQUID connected between the output line and the other power line. The input signals and the power lines are connected to the input buffer in such a way as to perform a selected logical function on the input signals and provide the result on the output line.

Figure 15:
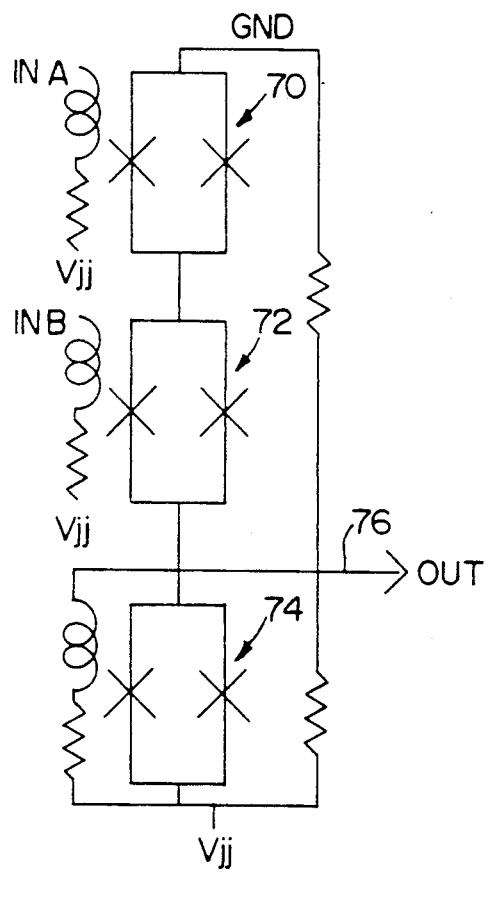
FIG. 15 is a schematic diagram of an alternate embodiment of the invention for performing the same function as the input buffer of FIG. 6, but including multiple SQUIDs in series instead of in parallel.

FIG. 15 is another embodiment of the input buffer, also configured to perform a NAND function by way of illustration. This form of the input buffer includes three SQUIDs 70, 72 and 74 stacked "vertically," i.e. connected in series, with the $V_{jj}$ power line being applied to the lower SQUID 74 and the upper SQUID 70 being connected to ground. Input signals A and B are applied to the respective control inductors of SQUIDs 70 and 72, each of which has its opposite end connected to the $V_{jj}$ power line. The control inductor for the lower SQUID 74 is connected in parallel with the SQUID junctions, and output is provided on line 76 connected to the lower SQUID 74, on the terminal opposite to the $V_{jj}$ connection for that SQUID.

If either input is low, there will be a control current for the corresponding SQUID and at least one of the SQUIDs 70, 72 will be resistive. The remaining SQUID 74 will function as a pull-up SQUID and the output line 76 will be pulled high. If both inputs A and B are high, there will be no control current in both SQUIDs 70, 72 and both will become superconductive, pulling the output line 76 to ground. Thus the function of a NAND gate is performed, but with an important difference from the FIG. 6 NAND gate input buffer. In the FIG. 6 circuit, each of the input signals controls a separate pull-up SQUID and the pull-up SQUIDs are connected in parallel. When superconductivity is suppressed in the input SQUIDs, they contribute a leakage current that is cumulative because of the parallel connection of the SQUIDs. In the FIG. 15 embodiment of the input buffer, the input SQUIDs are in series and, in theory, a virtually unlimited number of inputs can be combined without increasing the suppressed leakage current. The configuration of FIG. 15 can also be connected to provide all Boolean logic functions.

Figure 16:
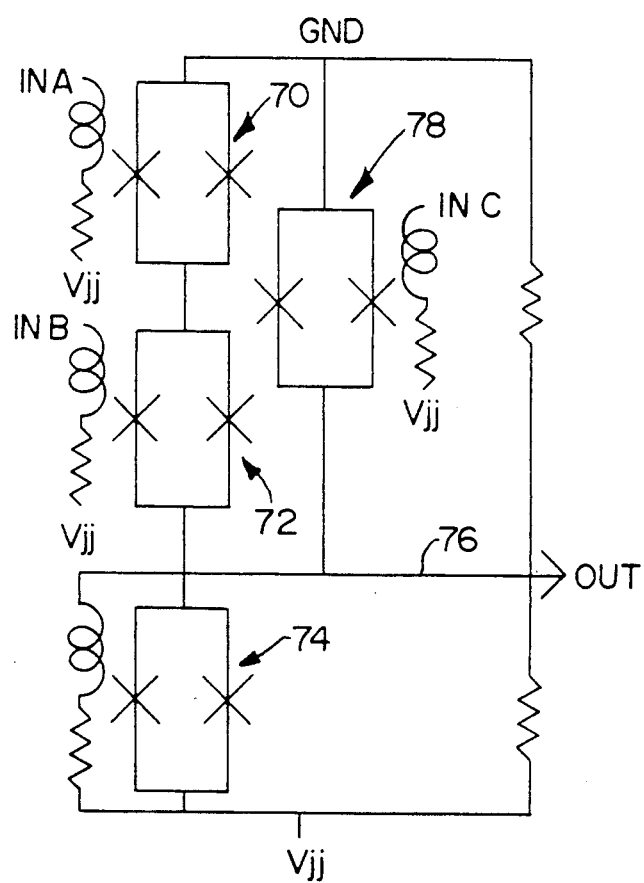
FIG. 16 is a schematic diagram of a logic gate in accordance with the invention, for performing a more complex logical function, shown by way of example as an AND-NOR function.

FIG. 16 is an example of a more complex logic gate incorporating an AND-NOR function, i.e. the output generated from inputs A, B and C is (A AND B) NOR C. The three SQUIDs 70, 72, 74 are connected identically with FIG. 15, but there is an additional SQUID 78 connected between ground and the output line 76. The C input signal is applied to the control inductor for this additional SQUID, and the opposite end of the control inductor is connected to the $V_{jj}$ power line. Thus, when C is high the additional SQUID 78 will be superconductive and will pull the output to ground. Further, it can be seen that the output can also be pulled to ground if both A and B are high. That is to say the output is low if A and B are high or if C is high, and the output is high if either A or B is low or C is high, which is the required AND-NOR function. An interesting aspect of this complex logic gate is that it is implemented using only one additional SQUID more than the basic function gate, for a total of only four SQUIDs.

The FIG. 16 logic gate is one of many different complex logic gates that can be implemented in much the same way. As in FIG. 16, these other complex logic gates modify the input buffer on one side of the output line, which is the side referred to as the pull-up side in this description.

Figure 17:
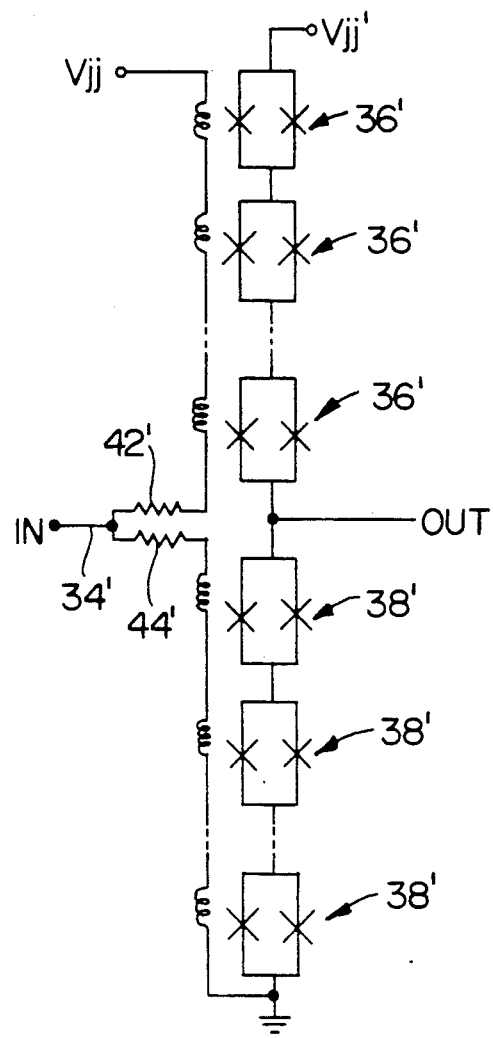
FIG. 17 is a schematic diagram of an alternate embodiment of the output buffer of FIG. 4.

FIG. 17 depicts an alternate form of an output buffer, which will be referred to as the high-voltage output buffer. Instead of the single pull-up SQUID 36 and single pull-down SQUID 38 that were shown in FIG. 4, this embodiment of the output buffer has multiple pull-up SQUIDs 36' connected in series and multiple pull-down SQUIDs 38' connected in series. An input line 34' supplies input signals through two resistors 42' and to a series-connected string of control inductors associated with the pull-up SQUIDs 36' and a series-connected string of control inductors associated with the pull-down SQUIDs 38'. The power supply voltage $V_{jj}$ is connected to the other end of the pull-up series string of control inductors, and there is a ground connection to the other end of the pull-down series string of control inductors. A higher voltage power supply line $V_{jj}'$ is applied to the pull-up SQUIDs 36' themselves.

The control currents in the FIG. 17 circuit are the same as in the FIG. 4 output buffer circuit, and the resistors 42' and 44' will have substantially the same value as the resistors 42 and 44 in FIG. 4. When the input is high, for example, the pull-up SQUIDs 36' will be superconductive and the pull-down SQUIDs 38' will be resistive. The output line will be pulled up to the $V_{jj}'$ voltage, which will in general be higher than $V_{jj}$. The purpose of this form of the output buffer is to permit logic circuits formed on an integrated circuit to drive other circuitry located off-chip, at a higher voltage. In particular, this form of output buffer can be easily designed to drive off-chip circuitry having a commonly employed characteristic impedance, such as 50 ohms.

Figure 18:
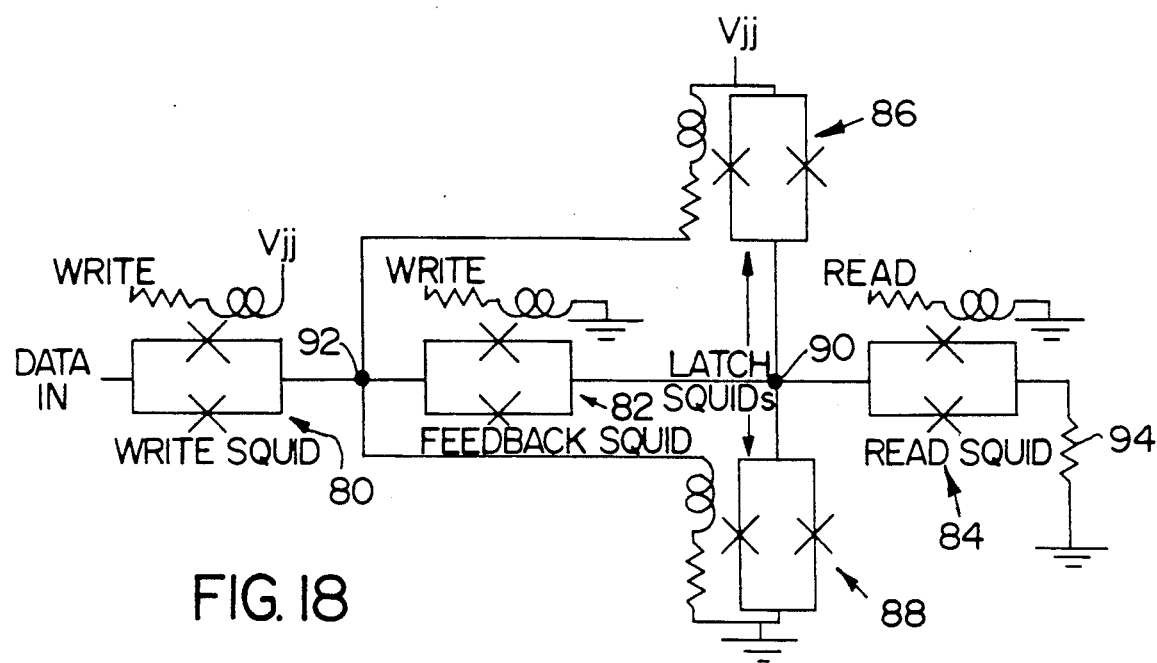
FIG. 18 is a schematic diagram of another embodiment of the invention, configured to form a two-port random access memory cell.

FIG. 18 depicts two-port random access memory (RAM) cell using the principles of the invention. The cell comprises four SQUIDs, referred to as a write SQUID 80, a feedback SQUID 82, a read SQUID 84 and two latch SQUIDs 86, 88. The latch SQUIDs 86, 88 are connected in series between a power line $V_{jj}$ and ground, and there is a cell status terminal, represented by the solid dot 90 at the junction between the two latch SQUIDs. The upper latch SQUID 86 functions as a pull-up circuit when it is superconductive, pulling the cell status terminal 90 high. The lower latch SQUID 88 functions as a pull-down circuit when superconductive, pulling the cell status point 90 to ground.

A data input signal is applied to the write SQUID 80, which is connected to an input data terminal 92. The feedback SQUID 82 is connected, in turn, from the input data terminal 92 to the status terminal 90. The input data terminal is also connected to the control inductors of the two latch SQUIDs 86, 88. The other terminals of the inductors are connected to $V_{jj}$ and to ground, respectively. A write signal is connected to one terminal of the control inductor of the write SQUID 80, the other terminal of the inductor being connected to $V_{jj}$. The write signal is also connected to one terminal of the control inductor of the feedback SQUID 82, the other terminal of the inductor being grounded.

When the write signal is high, no current flows in the control inductor of the write SQUID 80, which becomes superconductive. In effect the write SQUID in this state functions to gate the data input signal onto the input data terminal 92. The state of the latch SQUIDs 86, 88 will depend on the state of the data signal input to the terminal 92. If the input data signal is high, for example, the upper latch SQUID 86 will be superconductive, the lower latch SQUID 88 will be resistive, and the status terminal 90 will be pulled up to a high voltage $V_{jj}$. If the input data signal is low, the lower latch SQUID 88 will be superconductive and the status terminal 90 will be pulled down to ground. Thus, the status terminal reflects the state of the input data signal gated onto the input data terminal when a write signal goes high. When the write signal drops to a low state again, the feedback SQUID 82 becomes superconductive, and connects the status terminal 90 to the data input terminal 92, thereby latching the circuit until a subsequent write signal occurs.

Reading from the cell status terminal 90 is accomplished by applying a read signal to the control inductor of the read SQUID 84, the other terminal of the inductor being grounded. This SQUID is connected between the status terminal 90 and a grounded output load resistor 94. When the read signal is low, the read SQUID is superconductive and transfers the stored data signal out of the cell. However, the latch SQUIDs can supply sufficient current drive the output load without losing information, i.e. the data is retained in the memory cell.

It will be appreciated from the foregoing that the present invention represents a significant advance in the field of high-speed computing logic. Specifically, the invention provides a family of logic and memory circuits operating on the same principle and using the nonhysteretic characteristic of high temperature superconducting junctions to advantage. It will also be appreciated that, although several embodiments of the invention have been described in detail for purposes of illustration, various modifications may be made without departing from the spirit and scope of the invention. Accordingly, the invention is not to be limited except as by the appended claims.

We claim:

1. A superconducting nonhysteretic logic circuit, comprising:
    an output circuit;
    at least one pull-up nonhysteretic SQUID, connected to selectively couple the output circuit to a first power supply line having a first voltage state;
    at least one pull-down nonhysteretic SQUID, connected to selectively couple the output circuit to a second power supply line having a second voltage state; and
    at least one input circuit, connected to the pull-up and pull-down SQUIDs, to control switching of the SQUIDs between a superconducting state and resistive state, wherein the voltage on the output circuit is pulled to the first or second voltage state, depending on the states of signals applied to the input circuit;

and wherein the pull-up SQUID has a control inductor with one terminal connected to the first power supply line and the other terminal connected to the input circuit;

the pull-down SQUID has a control inductor with one terminal connected to the second power supply line and the other terminal connected to the input circuit; and the voltage state of the input circuit determines which of the SQUIDs becomes superconductive, which determines the voltage state of the output circuit, whereby the logic circuit functions as a non-inverting buffer.

2. A superconducting nonhysteretic logic circuit, comprising:

an output circuit;

at least one pull-up nonhysteretic SQUID, connected to selectively couple the output circuit to a first power supply line having a first voltage state;

at least one pull-down nonhysteretic SQUID, connected to selectively couple the output circuit to a second power supply line having a second voltage state; and at least one input circuit, connected to the pull-up and pull-down SQUIDs, to control switching of the SQUIDs between a superconducting state and a resistive state, wherein the voltage on the output circuit is pulled to the first or second voltage state, depending on the states of signals applied to the input circuit;

and wherein there are multiple pull-up SQUIDs connected in series and multiple pull-down SQUIDs connected in series;

the multiple pull-up SQUIDs have control inductors connected in series between the input circuit and a third power supply line;

the multiple pull-down SQUIDs have control inductors connected in series between the input circuit and the second power supply line;

the voltage state of the input circuit determines which of the SQUIDs becomes superconductive, which determines the voltage state of the output circuit, whereby the logic circuit functions as a non-inverting buffer; and the pull-up circuit pulls the output circuit to a higher voltage than is possible using single pull-up and pull-down SQUIDs.

3. A superconducting nonhysteretic logic circuit, comprising:

an output circuit;

at least one pull-up nonhysteretic SQUID, connected to selectively couple the output circuit to a first power supply line having a first voltage state;

at least one pull-down nonhysteretic SQUID, connected to selectively couple the output circuit to a second power supply line having a second voltage state; and at least one input circuit, connected to the pull-up and pull-down SQUIDs, to control switching of the SQUIDS between a superconducting state and resistive state, wherein the voltage on the output circuit is pulled to the first or second voltage state, depending on the states of signals applied to the input circuit;

and wherein there are multiple pull-up SQUIDs and multiple input circuits, connected to pull the output circuit to the first voltage state only when a selected logical combination of input signals is applied to the input circuits; and a single pull-down SQUID pulls the output circuit to the second voltage state only when the selected logical combination of input signals is not applied to the input circuits.

4. A superconducting nonhysteretic logic circuit as defined in claim 3, wherein:

there are at least two input circuits, and two pull-up SQUIDs connected in parallel between the first power supply line and the output circuit, the pull-up SQUIDs having control inductors; and the input circuits and the power supply lines are connected to the control inductors of the pull-up SQUIDs, and the voltages on the power supply lines are selected, to effect the desired logical combination of input signals.

5. A superconducting nonhysteretic logic circuit as defined in claim 4, wherein:

the voltage applied to the first power supply line is a logical "high" signal and the voltage applied to the second power supply line is a logical "low" signal;

the input circuits are connected to respective control inductors of the pull-up SQUIDs, the other terminals of the inductors being connected to the second power supply line; and one of the input circuits must both have a logical "low" input signal for the output circuit to be pulled to the "high" level of the first power supply line, whereby a "high" output is generated if the logical NAND of the input signals is "high."

6. A superconducting nonhysteretic logic circuit as defined in claim 4, wherein:

the voltage applied to the first power supply line is a logical "low" signal and the voltage applied to the second power supply line is a logical "high" signal;

the input circuits are connected to respective control inductors of the pull-up SQUIDs, the other terminals of the inductors being connected to the first power supply line; and one of the input circuits must both have a logical "low" input signal for the output circuit to be pulled to the "low" level of the first power supply line, whereby a "high" output is generated if the logical AND of the input signals is "high."

7. A superconducting nonhysteretic logic circuit as defined in claim 4, wherein:

the voltage applied to the first power supply line is a logical "high" signal and the voltage applied to the second power supply line is a logical "low" signal;

the input circuits are connected to respective control inductors of the pull-up SQUIDs, the other terminals of the inductors being connected to the first power supply line; and one of the input circuits must both have a logical "high" input signal for the output circuit to be pulled to the "high" level of the first power supply line, whereby a "high" output is generated if the logical OR of the input signals is "high."

8. A superconducting nonhysteretic logic circuit as defined in claim 4, wherein:

the voltage applied to the first power supply line is a logical "low" signal and the voltage applied to the second power supply line is a logical "high" signal;

the input circuits are connected to respective control inductors of the pull-up SQUIDs, the other terminals of the inductors being connected to the second power supply line; and one of the input circuits must both have a logical "high" input signal for the output circuit to be pulled to the "low" level of the first power supply line, whereby a "high" output is generated if the logical NOR of the input signals is "high."

9. A superconducting nonhysteretic logic circuit as defined in claim 3, wherein:

there are at least two input circuits, and two pull-up SQUIDs connected in series between the first power supply line and the output circuit, the pull-up SQUIDs having control inductors; and the input circuits and the power supply lines are connected to the control inductors of the pull-up SQUIDs, and the voltages on the power supply lines are selected, to effect the desired logical combination of input signals.

10. A superconducting nonhysteretic logic circuit as defined in claim 9, wherein:

the output circuit is pulled to the first voltage state when the input signals are in such a state that both of the series-connected pull-up SQUIDs are superconductive.

11. A superconducting nonhysteretic logic circuit, comprising:

an output circuit;

at least one pull-up nonhysteretic SQUID, connected to selectively couple the output circuit to a first power supply line having a first voltage state;

at least one pull-down nonhysteretic SQUID, connected to selectively couple the output circuit to a second power supply line having a second voltage state; and at least one input circuit, connected to the pull-up and pull-down SQUIDs, to control switching of the SQUIDs between a superconducting state and a resistive state, wherein the voltage on the output circuit is pulled to the first or second voltage state, depending on the states of signals applied to the input circuit;

and wherein the voltage applied to the first power supply line is a logical "high" signal and the voltage applied to the second power supply line is a logical "low" signal;

the pull-up SQUID has a control inductor; and the input circuit includes two input signal lines, connected to opposite ends of the control inductor, whereby the pull-up SQUID will become superconductive only when the input signals are in the same voltage state, pulling the output circuit to a "high" state if the logical exclusive NOR of the input signals is "high".

12. A superconducting nonhysteretic logic circuit, comprising:

an output circuit;

at least one pull-up nonhysteretic SQUID, connected to selectively couple the output circuit to a first power supply line having a first voltage state;

at least one pull-down nonhysteretic SQUID, connected to selectively couple the output circuit to a second power supply line having a second voltage state; and at least one input circuit, connected to the pull-up and pull-down SQUIDs, to control switching of the SQUIDs between a superconducting state and a resistive state, wherein the voltage on the output circuit is pulled to the first or second voltage state, depending on the states of signals applied to the input circuit;

and wherein the voltage applied to the first power supply line is a logical "low" signal and the voltage applied to the second power supply line is a logical "high" signal;

the pull-up SQUID has a control inductor; and the input circuit includes two input signal lines, connected to opposite ends of the control inductor, whereby the pull-up SQUID will become superconductive only when the input signals are in the same voltage state, pulling the output circuit to a "low" state if the logical exclusive OR of the input signals is "high".

13. A superconducting nonhysteretic logic circuit, comprising:

an output circuit;

at least one pull-up nonhysteretic SQUID, connected to selectively couple the output circuit to a first power supply line having a first voltage state;

at least one pull-down nonhysteretic SQUID, connected to selectively couple the output circuit to a second power supply line having a second voltage state; and at least one input circuit, connected to the pull-up and pull-down SQUIDs, to control switching of the SQUIDs between a superconducting state and a resistive state, wherein the voltage on the output circuit is pulled to the first or second voltage state, depending on the states of signals applied to the input circuit;

and wherein the pull-up SQUIDs has a control inductor connected by one terminal to the first power supply line and the pull-down SQUID has a control inductor connected by one terminal to the second power supply line;

the input circuit includes a data input terminal, a write SQUID, for selectively transmitting a data input signal onto the data input terminal, in the presence of a write signal applied to the write signal control inductor, and means for connecting the data input terminal to the other terminals of the control inductors of the pull-up and pull-down SQUIDs; and a data signal of the first or second voltage states causes the pull-up or the pull-down SQUID to superconduct, pulling the output circuit to the first or second voltage state.

14. A superconducting nonhysteretic logic circuit as defined in claim 13, and further comprising:

a feedback SQUID connected between the output circuit and the data input terminal, the feedback SQUID having a control inductor connected to render the feedback SQUID superconductive only when the write SQUID is not;

and wherein a data input signal is transferred from the input circuit to the output circuit on the occurrence of the write signal, and is maintained on the output circuit by the feedback SQUID after the write signal is removed.

15. A superconducting nonhysteretic logic circuit as defined in claim 14, wherein the output circuit further includes:
   a read SQUID, having a control inductor to which a read signal is applied to render it superconductive when data is to be read from the output circuit.

16. A superconducting nonhysteretic output buffer circuit, comprising:
   an output line;
   a "high" voltage power supply line;
   a grounded line;
   a pull-up nonhysteretic SQUID connected between the output line and the power supply line, and having a control inductor with one terminal connected to the power supply line;
   a pull-down nonhysteretic SQUID connected between the output line and the ground line, and having a control inductor with one terminal connected to the ground line; and
   an input line connected to the other terminals of the pull-up SQUID control inductor and the pull-down SQUID control inductor;
   and wherein a "high" voltage level on the input line causes the pull-up SQUID to superconduct and pulls the output line to the "high" voltage level, and a "low" voltage level on the input line causes the pull-down SQUID to pull the output line voltage to ground.

17. A superconducting nonhysteretic output buffer circuit, comprising:
   an output line;
   a first "high" voltage power supply line of voltage selected to drive and external circuit;
   a second "high" voltage power supply line for driving internal control inductors;
   a ground line;
   a plurality of series-connected pull-up nonhysteretic SQUIDs connected between the output line and the first power supply line, and having control inductors connected in a series string of which one end terminal is connected to the second power supply line;
   a plurality of series-connected pull-down nonhysteretic SQUIDs connected between the output line and the ground line, and having control inductors connected in a series string of which one end terminal is connected to the ground line; and
   an input line connected to the other end terminals of the string of pull-up SQUID control inductors and the string of pull-down SQUID control inductors;
   and wherein a "high" voltage level on the input line causes all of the pull-up SQUIDs to superconduct and pulls the output line to the second "high" voltage level, and a ground voltage level on the input line causes all of the pull-down SQUIDs to pull the output line voltage to ground.

18. A superconducting nonhysteretic logic circuit, comprising:
   a plurality of input lines;
   an output line;
   a first power supply line supplying a first logical voltage level;
   a second power supply line supplying a second logical voltage level;
   a pull-down circuit, including at least one pull-down SQUID connected between the output line and the second power supply line and having a control inductor; and
   a pull-up circuit, including at least one pull-up SQUID connected between the output line and the first power supply line, each pull-up SQUID in the pull-up circuit having a control inductor;
   and wherein the input lines and the first and second power supply lines are connected to selected terminals of the control inductors of the pull-up SQUIDs, to pull the output line to the first logical voltage level only when a selected combination of input signals is applied to the input lines, and wherein the pull-down SQUID pulls the output line to the second logical voltage level only when the selected combination of input signals is not applied to the input lines.

19. A superconducting nonhysteretic logic circuit as defined in claim 18, wherein:
   the pull-up circuit has two SQUIDs connected in parallel; and
   the output line is pulled to the first logical voltage level only when at least one of the two SQUIDs in the pull-up circuit is rendered superconductive when its control current is zero.

20. A superconducting nonhysteretic logic circuit as defined in claim 18, wherein:
   the pull-up circuit has two SQUIDs connected in series; and
   the output line is pulled to the first logical voltage level only when both of the SQUIDs in the pull-up circuit are rendered superconductive when their control currents are zero.

21. A superconducting nonhysteretic logic circuit as defined in claim 18, wherein:
   the pull-up circuit has two SQUIDs connected in series and a third SQUID connected in parallel with the first two SQUIDS; and
   the output line is pulled to the first logical voltage level if either the third SQUID is rendered superconductive or if both the first and second SQUIDs are rendered superconductive.

22. A superconducting nonhysteretic two-port random-access memory cell, comprising:
   memory storage line, which will be held at a first or a second voltage state;
   a first latch SQUID connected between the memory storage line and a first power supply line held at the first voltage state;
   a second latch SQUID connected between the memory storage line and a second power supply line held at the second voltage state;
   a write SQUID connected between a data input line and a data input terminal, and having a control inductor to which a momentary write signal may be applied to render the write SQUID superconductive and transmit a data input signal from the data input line to the data input terminal; and
   first and second latch SQUID control inductors, the first being connected between the first power supply line and the data input terminal, and the second being connected between the second power supply line and the data input terminal, whereby the presence of the data signal on the data input terminal causes one of the latch SQUIDs to be superconductive, pulling the memory storage line to the first or the second voltage state, to record the data input signal.

23. A superconducting nonhysteretic two-port random-access memory cell as defined in claim 22, and further comprising:
a feedback SQUID connected between the memory storage line and the data input terminal, the feedback SQUID having a control inductor to which the write signal is also applied, but to render the SQUID superconductive only in the absence of the momentary write signal, whereby a data signal stored in the cell as a voltage state on the memory storage line is connected to the control inductors of the latch SQUIDs during the absence of a write signal, to maintain the particular voltage state on the memory storage line.

24. A superconducting nonhysteretic two-port random-access memory cell as defined in claim 23, and further comprising:
a read SQUID connected to the memory storage line, and having a control inductor to which a momentary read signal may be applied to render the read SQUID superconductive, thereby copying a stored data signal out of the cell.

* * * * *